United States Patent
Wu et al.

(10) Patent No.: US 9,635,752 B2
(45) Date of Patent: Apr. 25, 2017

(54) PRINTED CIRCUIT BOARD AND ELECTRONIC DEVICE

(71) Applicant: BOE TECHNOLOGY GROUP CO., LTD., Beijing (CN)

(72) Inventors: Yue Wu, Beijing (CN); Yan Ren, Beijing (CN); Zifeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 14/653,723

(22) PCT Filed: Oct. 24, 2014

(86) PCT No.: PCT/CN2014/089432
§ 371 (c)(1),
(2) Date: Jun. 18, 2015

(87) PCT Pub. No.: WO2015/196673
PCT Pub. Date: Dec. 30, 2015

(65) Prior Publication Data
US 2016/0270214 A1    Sep. 15, 2016

(30) Foreign Application Priority Data
Jun. 26, 2014    (CN) .................... 2014 2 0351013 U

(51) Int. Cl.
H05K 1/02    (2006.01)
H05K 1/11    (2006.01)
H05K 1/16    (2006.01)

(52) U.S. Cl.
CPC ......... *H05K 1/0233* (2013.01); *H05K 1/0225* (2013.01); *H05K 1/0228* (2013.01); *H05K 1/0231* (2013.01); *H05K 1/115* (2013.01); *H05K 1/162* (2013.01); *H05K 2201/083* (2013.01); *H05K 2201/093* (2013.01)

(58) Field of Classification Search
CPC .................................................... H05K 1/0233
See application file for complete search history.

(56) References Cited

U.S. PATENT DOCUMENTS

2011/0222247 A1*    9/2011    Motohashi ........... H05K 1/0227
                                                                    361/748

* cited by examiner

*Primary Examiner* — Jeremy C Norris
(74) *Attorney, Agent, or Firm* — Harness, Dickey & Pierce, P.L.C.

(57) ABSTRACT

The present disclosure relates to the field of circuits, and provides a printed circuit board (PCB) and an electronic device. The PCB includes a substrate and a wiring layer arranged at the substrate. The wiring layer includes a digital region and an analog region, and a gap region is defined between the digital region and the analog region. The substrate is provided with a hole in the gap region, and the digital region and the analog region of the wiring layer are connected through a magnetic bead.

18 Claims, 2 Drawing Sheets

PRINTED CIRCUIT BOARD AND ELECTRONIC DEVICE

CROSS-REFERENCE TO RELATED APPLICATION

This application is the U.S. national phase of PCT Application No. PCT/CN2014/089432 filed on Oct. 24, 2014, which claims a priority to Chinese Patent Application No. 201420351013.9 filed on Jun. 26, 2014, the disclosure of which is incorporated in its entirety by reference herein.

TECHNICAL FIELD

The present disclosure relates to the field of circuits, in particular to a printed circuit board for reducing electromagnetic interference and an electronic device.

BACKGROUND

A printed circuit board, abbreviated as PCB, is not only a critical electronic component, but also a support for electronic components, as well as an electrical connection carrier of the electronic components. It is referred as to the "printed" circuit board as being manufactured by an electron printing process.

A typical PCB includes a wiring layer partitioned into a digital region and an analog region, which is obtained by partitioning a copper surface on the wiring layer of the PCB at a joint edge between the digital region and the analog region, so that a certain insulation gap is formed between copper in two regions. Then a plurality of magnetic beads is arranged to connect the digital region with the analog region, so as to provide a return loop for an analog signal.

Since the wiring layer of the typical PCB is partitioned in such manner, it is difficult to control partition spacing. Further, copper coils of large area in the digital region and the analog region are insulated and separated from each other only through a short distance, and thus a large amount of electromagnetic interference will be generated therebetween. Furthermore, at a PCB layout stage, it is likely to neglect a component or a wire across the partition, resulting in a weak control.

SUMMARY

In order to solve the problem that a large amount of electromagnetic interference is generated when partitioning a wiring layer of an existed printed circuit board into an analog region and a digital region, the present disclosure provides a printed circuit board (PCB) for reducing the electromagnetic interference and an electronic device including the PCB.

In one aspect, the present disclosure provides a printed circuit board (PCB), including a substrate and a wiring layer arranged at the substrate; the wiring layer includes a digital region and an analog region, and a gap region is defined between the digital region and the analog region; the substrate is provided with a hole in the gap region, and the digital region and the analog region of the wiring layer are connected through a magnetic bead.

Alternatively, the substrate is provided with a plurality of holes in the gap region, and the magnetic bead is arranged between adjacent holes.

Alternatively, the PCB further includes a capacitor which connects the digital region with the analog region of the wiring layer; the capacitor is arranged between adjacent holes.

Alternatively, at least one of the magnetic bead and the capacitor is arranged between adjacent holes.

Alternatively, the PCB further includes a ground layer and a power layer which are stacked with the wiring layer; the wiring layer includes a top wiring layer and a bottom wiring layer, and the ground layer and the power layer are arranged between the top wiring layer and the bottom wiring layer.

Alternatively, the ground layer includes a first region corresponding to the digital region and a second region corresponding to the analog region; the power layer includes a third region corresponding to the digital region and a fourth region corresponding to the analog region; the first region has an area larger than that of the third region, and the second region has an area larger than that of the fourth region.

Alternatively, the ground layer is provided with via holes penetrating through the wiring layer, the ground layer and the power layer at positions of the first region and the second region close to the gap region, respectively.

Alternatively, a distance between the power layer and the gap region is greater than or equal to 0.5 mm, and a distance between the power layer and a periphery is greater than or equal to 0.5 mm.

Alternatively, the hole has a width greater than 1 mm and a length greater than 3 mm.

Alternatively, a distance within the gap region between the digital region and the analog region of the wiring layer is greater than or equal to 0.5 mm.

In another aspect, the present disclosure further provides an electronic device including the above printed circuit board (PCB).

The present disclosure has following advantageous effects. In the PCB according to the present embodiment, the hole is defined in the gap region between the digital region and the analog region of the wiring layer, and the digital region and the analog region of the wiring layer are connected through the magnetic bead, so that a digital signal and an analog signal may be distributed in a most independent manner on the basis of physical separation, resulting in an increased distance between the digital region and the analog region which are independent from each other, thereby to reduce electromagnetic interference generated during a digital-to-analog conversion, and guarantee the integrity and independence of the digital signal and the analog signal.

DETAILED DESCRIPTION

In order to make the problem to be solved, the technical solutions and the advantages of the present disclosure more apparent, the present disclosure will be described hereinafter in conjunction with the drawings and the embodiments.

Figure 1:
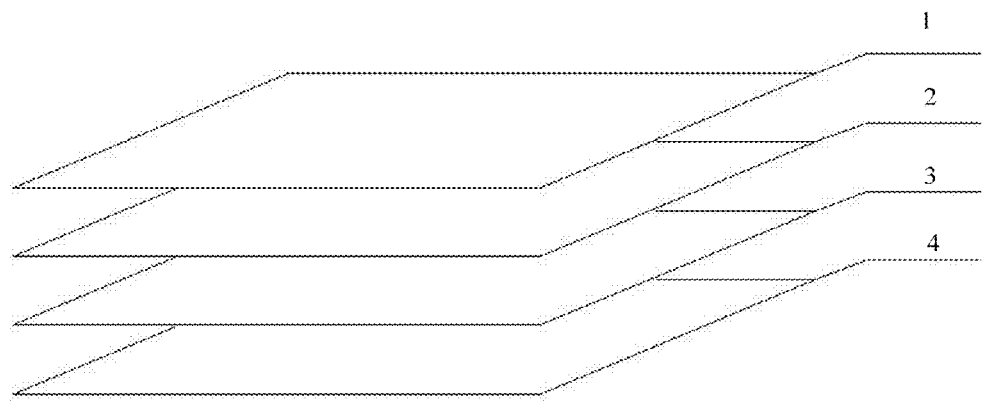
FIG. 1 is a schematic view of a printed circuit board according to one embodiment of the present disclosure.

As shown in FIG. 1, which is a schematic view of a printed circuit board (PCB) according to one embodiment of the present disclosure, the PCB includes a top wiring layer 1, a ground layer 2, a power layer 3 and a bottom wiring layer 4. The ground layer 2 and the power layer 3 are arranged between the two wiring layers. The wiring layers, the ground layer and the power layer are arranged at a substrate (not shown). The PCB according to the present embodiment is illustrated as being of a four-layer structure, which may also be of a two or more-layer structure and is not defined herein. The top wiring layer and the bottom wiring layer are configured to arrange wires of a circuit. The power layer is mainly for current delivery. The ground layer is of a grounded characteristic and is configured to form a signal loop. The power layer and the ground layer are used as reference layers of the top wiring layer and the bottom wiring layer, respectively.

Figure 2:
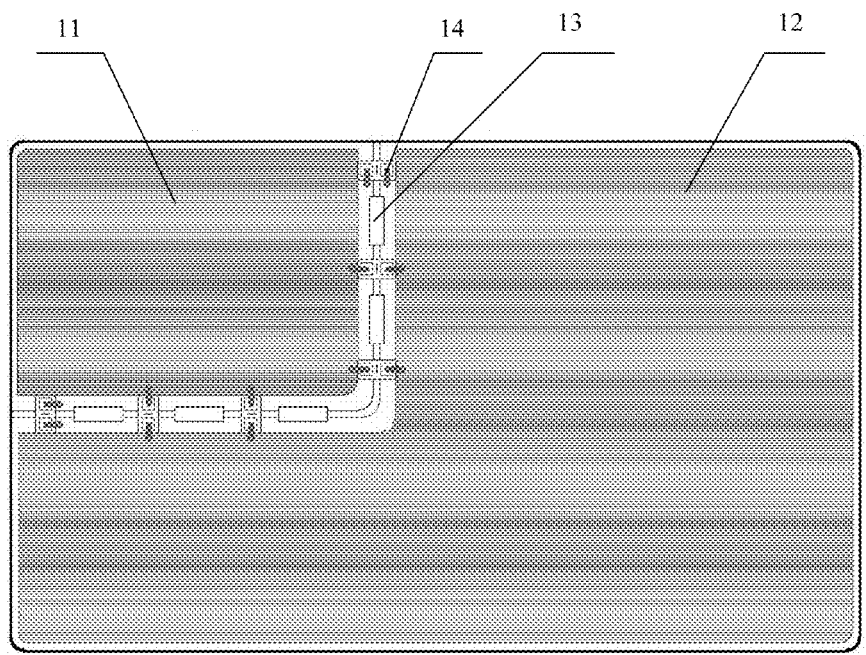
FIG. 2 is a partial enlargement view of FIG. 1.

As shown in FIG. 2, which is a partial enlargement view of FIG. 1, the PCB according to the present embodiment includes a substrate and a wiring layer 1 at the substrate. The wiring layer 1 includes a digital region 11 and an analog region 12. A gap region is defined between the digital region and the analog region. A hole 13 is defined in the substrate in the gap region. The digital region and the analog region of the wiring layer are connected through a magnetic bead 14.

In the PCB according to the present embodiment, the hole is defined in the gap region between the digital region and the analog region of the wiring layer, and the digital region and the analog region of the wiring layer are connected through the magnetic bead, so that a digital signal and an analog signal may be distributed in a most independent manner on the basis of physical separation, resulting in an increased distance between the digital region and the analog region which are independent from each other, thereby to reduce electromagnetic interference generated during a digital-to-analog conversion, and guarantee the integrity and independence of the digital signal and the analog signal.

In the wiring layer according to the present embodiment, there is a plurality of holes 13 defined in the gap region between the digital region and the analog region. The magnetic bead 14 is arranged between adjacent holes, so as to provide a return loop for the analog signal. According to the present embodiment, the magnetic bead 14 has two connection pins, which are connected to the digital region and the analog region of the wiring layer, respectively, thereby to achieve the connection between the digital region and the analog region.

According to the present embodiment, the PCB further includes a capacitor, which is connected with the digital region and the analog region of the wiring layer. The capacitor is arranged between adjacent holes. At least one of the capacitor and the magnetic bead is arranged between adjacent holes. The capacitor is used to achieve functions such as filtering. The capacitor may be arranged in accordance with requirements, which may be one or more.

Figure 3:
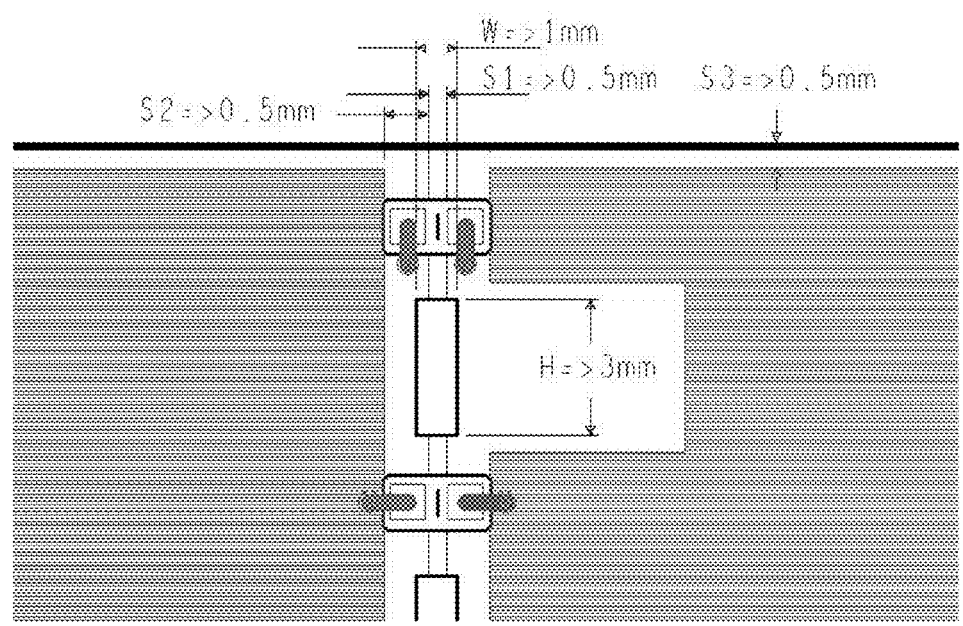
FIG. 3 is a schematic view showing a specific structure of the printed circuit board according to one embodiment of the present disclosure.

As shown in FIG. 3, which is a schematic view showing a specific structure of the printed circuit board according to one embodiment of the present disclosure, the ground layer includes a first region corresponding to the digital region and a second region corresponding to the analog region. The power layer includes a third region corresponding to the digital region and a fourth region corresponding to the analog region. The first region has an area larger than that of the third region. The second region has an area larger than that of the fourth region. In the power layer according to the present embodiment, areas corresponding to the digital region and the analog region are smaller than those of corresponding regions of the ground layer, so that the power layer is formed as a retracted structure, so as to effectively prevent generation of the electro-magnetic interference (EMI). According to the present embodiment, the power layer is retracted 0.5 mm with respect to the ground layer, thereby to effectively prevent a short circuit due to a narrow partition. Of course, other suitable retracted sizes may be set in accordance with requirements.

Referring to FIG. 3, according to present embodiment, the hole has a length H greater than 3 mm and a width W greater than 1 mm. The PCB is hollowed in accordance with such sizes at a partition edge at intervals. The analog region and the digital region is partitioned in a physical process, which greatly decreases an area of adjacent regions between analog copper and digital copper, thereby to reduce a signal and electro-magnetic interference area of the two regions as much as possible. According to the present embodiment, a distance S1 within the gap between the digital region and the analog region of the wiring layer is greater than or equal to 0.5 mm, and a distance S2 between the power layer and the gap is greater than or equal to 0.5 mm, a distance S3 between the power layer and a periphery is greater than or equal to 0.5 mm.

According to the present embodiment, the ground layer is also provided with via holes penetrating through the wiring layers, the ground layer and the power layer at positions of the first region and the second region close to the gap region, which contributes to conduction of layer signal lines laid on the top wiring layer, the bottom wiring layer and the ground layer. The analog region and the digital region are both provided with holes at their peripheries, respectively, so as to provide a timely return loop for the analog region and the digital region, thereby to prevent generation of electromagnetic interference in time.

The present disclosure further provides an electronic device, which includes any one of the above PCBs. The electronic device may be any product or component having an electronic component, such as a mobile phone, a television, a computer, a printer, an air-conditioner, a refrigerator, a washing machine and a microwave oven.

The above are merely preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A printed circuit board (PCB), comprising a substrate and a wiring layer arranged at the substrate;
   wherein the wiring layer comprises a digital region and an analog region, and a gap region is defined between the digital region and the analog region; the substrate is provided with a plurality of holes in the gap region, and the digital region and the analog region of the wiring layer are connected through a plurality of magnetic beads;
   wherein the plurality of holes and the plurality of magnetic beads are alternately arranged along an extending direction of the gap region.

2. The PCB according to claim 1, further comprising a capacitor which connects the digital region with the analog region of the wiring layer; wherein the capacitor is arranged between adjacent holes.

3. The PCB according to claim 2, wherein at least one of the plurality of magnetic beads and the capacitor is arranged between adjacent holes.

4. The PCB according to claim 1, further comprising a ground layer and a power layer which are stacked with the wiring layer; wherein the wiring layer comprises a top wiring layer and a bottom wiring layer, and the ground layer and the power layer are arranged between the top wiring layer and the bottom wiring layer.

5. The PCB according to claim 4, wherein the ground layer comprises a first region corresponding to the digital region and a second region corresponding to the analog region; the power layer comprises a third region corresponding to the digital region and a fourth region corresponding to the analog region; the first region has an area larger than that of the third region, and the second region has an area larger than that of the fourth region.

6. The PCB according to claim 4, wherein the ground layer is provided with via holes penetrating through the wiring layer, the ground layer and the power layer at positions of the first region and the second region close to the gap region, respectively.

7. The PCB according to claim 4, wherein a distance between the power layer and the gap region is greater than or equal to 0.5 mm, and a distance between the power layer and a periphery of the PCB is greater than or equal to 0.5 mm.

8. The PCB according to claim 1, wherein each of the plurality of holes has a width greater than 1 mm and a length greater than 3 mm.

9. The PCB according to claim 1, wherein a distance within the gap region between the digital region and the analog region of the wiring layer is greater than or equal to 0.5 mm.

10. The electronic device according to claim 1, wherein each of the plurality of holes has a width greater than 1 mm and a length greater than 3 mm.

11. The electronic device according to claim 1, wherein a distance within the gap region between the digital region and the analog region of the wiring layer is greater than or equal to 0.5 mm.

12. An electronic device, comprising a printed circuit board (PCB);
wherein the PCB comprises a substrate and a wiring layer arranged at the substrate;
wherein the wiring layer comprises a digital region and an analog region, and a gap region is defined between the digital region and the analog region; the substrate is provided with a plurality of holes in the gap region, and the digital region and the analog region of the wiring layer are connected through a plurality of magnetic beads;
wherein the plurality of holes and the plurality of magnetic beads are alternately arranged along an extending direction of the gap region.

13. The electronic device according to claim 12, wherein the PCB further comprises a capacitor which connects the digital region with the analog region of the wiring layer; wherein the capacitor is arranged between adjacent holes.

14. The electronic device according to claim 13, wherein at least one of the plurality of magnetic beads and the capacitor is arranged between adjacent holes.

15. The electronic device according to claim 12, wherein the PCB further comprises a ground layer and a power layer which are stacked with the wiring layer; wherein the wiring layer comprises a top wiring layer and a bottom wiring layer, and the ground layer and the power layer are arranged between the top wiring layer and the bottom wiring layer.

16. The electronic device according to claim 15, wherein the ground layer comprises a first region corresponding to the digital region and a second region corresponding to the analog region; the power layer comprises a third region corresponding to the digital region and a fourth region corresponding to the analog region; the first region has an area larger than that of the third region, and the second region has an area larger than that of the fourth region.

17. The electronic device according to claim 15, wherein the ground layer is provided with via holes penetrating through the wiring layer, the ground layer and the power layer at positions of the first region and the second region close to the gap region, respectively.

18. The electronic device according to claim 15, wherein a distance between the power layer and the gap region is greater than or equal to 0.5 mm, and a distance between the power layer and a periphery of the PCB is greater than or equal to 0.5 mm.

* * * * *